United States Patent
Jerez (10) Patent No.: US 8,253,334 B2
(45) Date of Patent: Aug. 28, 2012

(54) ION SOURCE

(75) Inventor: Manuel A. Jerez, Roosevelt, NY (US)

(73) Assignee: Ion Technology Solutions, LLC, Mineola, NY (US)

( * ) Notice: Subject to any disclaimer, the term of this patent is extended or adjusted under 35 U.S.C. 154(b) by 77 days.

(21) Appl. No.: 12/804,277

(22) Filed: Jul. 19, 2010

(65) Prior Publication Data

US 2012/0013249 A1    Jan. 19, 2012

(51) Int. Cl.
*H01J 27/08* (2006.01)
*H01J 61/04* (2006.01)
*H01J 1/88* (2006.01)

(52) U.S. Cl. ........ 313/613; 313/326; 313/352; 313/292; 250/426

(58) Field of Classification Search ........................ None
See application file for complete search history.

(56) References Cited

U.S. PATENT DOCUMENTS

| | | | | |
|---|---|---|---|---|
| 2,677,060 | A * | 4/1954 | Woodward et al. | 250/425 |
| 2004/0000651 | A1* | 1/2004 | Horsky et al. | 250/492.21 |
| 2008/0129180 | A1* | 6/2008 | Murrell et al. | 313/337 |
| 2010/0320395 | A1* | 12/2010 | Hahto et al. | 250/426 |

* cited by examiner

*Primary Examiner* — Ashok Patel
(74) *Attorney, Agent, or Firm* — Francis C. Hand; Carella, Byrne et al.

(57) ABSTRACT

A cathode sub-assembly is comprised of a retainer, a cathode and a collar, each of which has smooth unthreaded surfaces that slidably engage each other. A shield serves to hold the sub-assembly in a support plate. The cathode projects from the sub-assembly into an arc chamber with a tortuous path created therebetween for passage of a plasma flow.

4 Claims, 9 Drawing Sheets

ION SOURCE

This invention relates to an ion source. More particularly, this invention relates to an ion source that is typically used in ion implanters. Still more particularly, this invention relates to an indirectly heated cathode assembly and a directly heated cathode assembly.

As is known, in the manufacture of semi-conductors, ion implanters are widely used to diffuse or implant positive ions onto regions of a semi-conductor wafer. These ion implanters use an ion source that generates an ion beam used to implant the semi-conductor wafers. The ion implanters may be of the indirectly heated cathode ion source type or a directly heated cathode type.

As is also known, an indirectly heated cathode ion source includes an arc chamber, cathode assembly, filament, insulator block, graphite support plate, and a filament clamp assembly. The filament is positioned within a cavity defined by the cathode assembly and a cathode within the cathode assembly is heated by an electron bombardment from the filament. The cathode, in turn, emits electrons thermionically for generating a plasma along with a specific gas species within the arc chamber. An example of such an indirectly heated cathode ion source is described in co-pending U.S. patent application Ser. No. 12/655,347, filed Dec. 29, 2009.

A directly heated cathode generally includes an arc chamber, filament clamp assembly, and a filament positioned inside the arc chamber. The filament emits electrons thermionically for generating a plasma along with a specific gas species within the arc chamber.

It is an object of this invention to improve the lifetime and manufacture of an ion source as well as reducing the downtime frequency for servicing the ion implanter.

It is another object of this invention to reduce the complexity of a filament clamp assembly of an ion source.

It is another object of this invention to provide a filament clamp assembly that is retrofitable to various existing ion implanters.

It is another object of this invention to reduce heat loss from a cathode of an ion source thereby reducing the heat loss from the arc chamber thereby increasing the efficiency of the arc chamber.

It is another object of this invention to reduce heat loss from the filament of an ion source thereby reducing the heat loss from the arc chamber thereby increasing the efficiency of the arc chamber.

It is another object of this invention to increase the efficiency and lifetime of a filament of an ion implanter.

It is another object of this invention to provide a single insulating block to electrically isolate a filament clamp in an ion source.

It is another object of this invention to prevent the buildup of a conductive coating on an insulating block an ion source.

It is another object of this invention to slow down and reduce the amount of plasma escaping from an arc chamber an ion source.

Briefly, the invention provides a cathode sub-assembly comprising a retainer, a cathode and a collar, each of which has smooth unthreaded surfaces that slidably engage each other.

The invention further provides a cathode assembly comprising a graphite support plate; a cathode sub-assembly mounted in the support plate; an insulator block mounted in the support plate; a shield mounted on the support plate in covering over relation to the insulator block to prevent formation of a conductive coating on the insulator block; and a filament clamp assembly mounted on the support plate.

The cathode sub-assembly, as above, includes a cathode of cylindrical cross-sectional shape having a cavity open to one end of the cathode and an end wall defining an end of the cavity while filament clamp assembly includes a filament having a pair of parallel connecting leads extending into the cavity of the cathode and a loop extending between the leads and spaced a predetermined distance from the end wall of the cathode.

The support plate and shield cooperate to provide a means for holding the cathode and insulator block. The shield prevents the buildup of a conductive coating caused by gases escaping from the arc chamber onto the insulating block. A conductive coating on the insulator block would otherwise cause a short circuit in the filament clamp assembly causing a shutdown of the ion source. The shield dramatically extends the life of the insulator block thereby reducing downtime frequency of the ion implanter.

The invention further provides a filament clamp assembly comprised of a pair of clamps that are disposed in parallel relation for receiving a filament having a pair of connecting leads and a loop extending between the connecting leads. In addition, the filament clamp assembly has thermal insulating sleeves to support the filament and restrict heat transfer away from the emitting surface of the filament thereby increasing the efficiency of the filament and ion source.

The invention further provides an indirectly heated cathode ion source comprising an arc chamber; an arc chamber support having the arc chamber mounted thereon; and an ion source assembly connected to the arc chamber support.

The ion source is constructed, as above, with an insulator block secured to the arc chamber support; a graphite support plate mounted on the insulator block; a cathode assembly mounted in the support plate and having a cathode extending into the arc chamber; a shield mounted on the support plate in covering over relation to the insulator block to prevent formation of a conductive coating on the insulator block; and a filament clamp assembly mounted on the support plate. The filament clamp assembly includes a filament having a pair of parallel connecting leads extending into the cavity of the cathode and a loop extending between the leads and spaced a predetermined distance from the end wall of the cathode.

The arc chamber includes a sleeve and an arc chamber liner which cooperate with the cathode, retainer, and support plate to create an intricate path with a minimum gap for plasma to escape from the arc chamber.

The invention further provides a directly heated cathode ion source comprising an arc chamber; an arc chamber support having the arc chamber mounted thereon; an insulator block secured to the arc chamber support; and a filament clamp assembly mounted on the insulator block. In this embodiment, the filament clamp assembly includes a filament having a pair of parallel connecting leads extending into the arc chamber and a loop extending between the leads and disposed within the arc chamber. In addition, a thermal insulating sleeve and a cooperating shield create an intricate (tortuous) path with a minimum gap for plasma to escape from the arc chamber.

The invention further provides a repeller (or anti-cathode) assembly for mounting in an arc chamber. In this embodiment, the arc chamber has an opening in one end thereof; a tubular shield is secured in and projects outwardly from the opening in the arc chamber; and an insulator ring is threadably mounted on the tubular shield and abuts the arc chamber.

The repeller assembly includes a repeller, typically made from tungsten, having an enlarged body at one end within the arc chamber and a stem that passes through the opening of the arc chamber, the tubular shield and the insulator ring while defining a gap between the stem and each of the opening, the tubular shield and the insulator ring. In addition, a lock nut is threaded onto an end of the stem into abutment with the insulator ring to hold the repeller in cantilevered relation within the arc chamber.

The insulator ring is made from a high temperature ceramic material and electrically isolates the repeller from the arc chamber. The shield and insulator cooperate to create an intricate path with a minimum gap for the plasma to escape or condense while preventing a short circuit.

These and other objects and advantages of the invention will become more apparent from the following detailed description taken in conjunction with the accompanying drawings wherein:

Figures 1, 2:
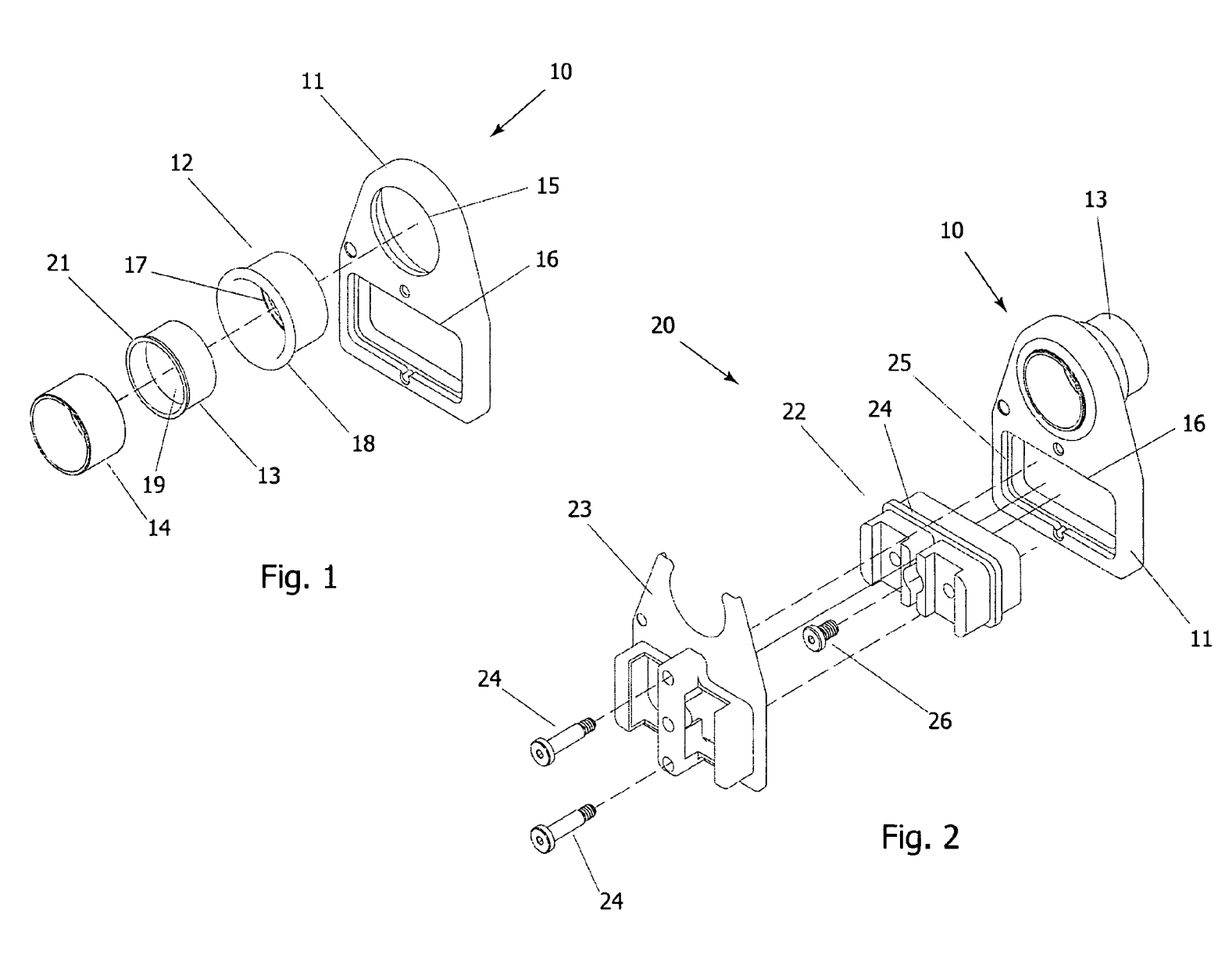
FIG. 1 is an exploded perspective view of a cathode sub-assembly constructed in accordance with the invention.
FIG. 2 is an exploded perspective view of a cathode assembly constructed in accordance with the invention.
Figure 4:
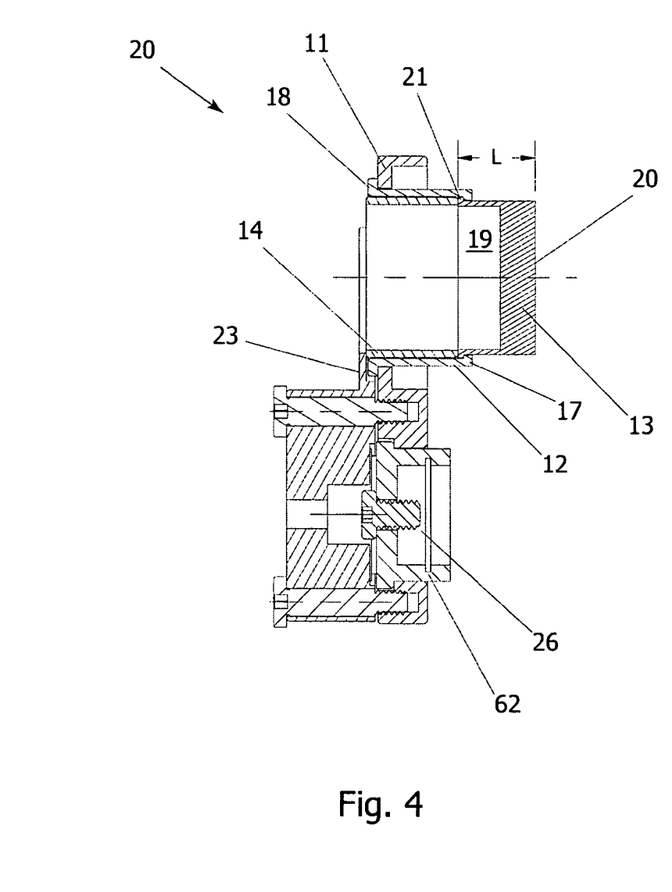
FIG. 4 is a cross sectional view of the cathode assembly taken on line 4-4 of FIG. 3.

Referring to FIGS. 1 and 4, the cathode sub-assembly 10 consists of a graphite support plate 11, a retainer 12, a cathode 13 and a collar (spacer) 14.

The graphite support plate 11 has an aperture 15 of circular shape in an upper end for receiving the retainer 12 and a second aperture 16 of rectangular shape for purposes as described below.

The retainer 12 defines a passage of circular cross-section and has a radially inwardly directed rib 17 at one end within the passage and a radially outwardly directed flange 18 at the opposite end.

The cathode 13 is of cup-shape to define a cylindrical cross-sectional shape that extends into the retainer 12 in a slide fit manner. The cathode 13 has a cavity 19 open to one end of the cathode 13, an end wall 20 at the opposite end that defines an end of the cavity 19 and an annular flange 21 at the open end that extends radially outwardly thereof and abuts the rib 17 of the retainer 12 when mounted within the retainer 12.

The collar 14 is slidably mounted in the retainer 12 against the cathode 13 to abut the flange 21 of the cathode 13 with the flange 21 disposed between the rib 17 of the retainer 12 and the collar 14. As indicated in FIG. 4, the inside diameter of the collar 14 is the same as the inside diameter of the cathode 13 such that the collar 14 provides a smooth transition to the cavity 19 of the cathode 13. The collar 14 is also of a length to terminate at the open end in the same transverse plane as the open end of the retainer 12.

Referring to FIG. 4, the retainer 12 is slidably mounted in the upper aperture 15 of the graphite support plate 11 such that the flange 18 abuts the face of the support plate 11. In addition, when mounted in place against the internal rib 17 of the retainer 12, the cathode 13 is of a length L to project beyond the retainer 12.

The cathode 13 is typically made of tungsten of reduced length and mass. The short length restricts heat transfer away from the cathode; electron emission is enhanced and concentrated over the emitting surface of the cathode.

The retainer 12 and collar 14 are made from a thermally insulating material, such as graphite, to also restrict heat transfer away from the cathode 13 thereby increasing the efficiency of the cathode 13.

Figure 3:
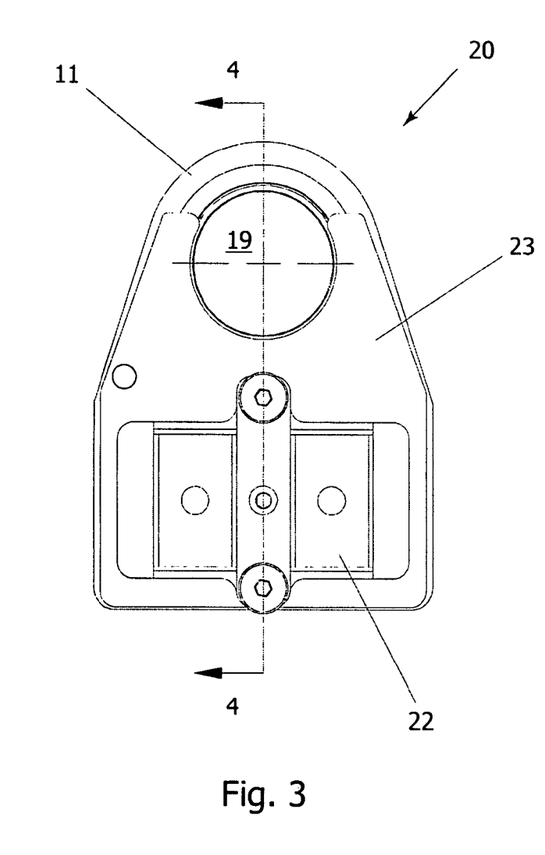
FIG. 3 is a front view of the cathode assembly of FIG. 2.

Referring to FIGS. 2 to 4, the cathode assembly 20, in addition to the cathode sub-assembly 10, includes an insulator block 22 mounted in the aperture 16 in the lower part of the support plate 11 and a shield 23 mounted on the support plate 11 in covering over relation to the insulator block 22 to prevent formation of a conductive coating on the insulator block 22.

The insulator block 22 is of rectangular shape to matingly fit into the aperture 16 of the graphite support plate 11 and has a peripheral flange 24 that fits into a recessed shoulder 25 in the support plate 11 about the aperture 16.

A socket head cap screw 26 is threaded into the insulator block 22 for purposes as described below. As indicated, the cap screw 26 may be accessed through an aperture in the shield 23.

The shield 23 is attached to the graphite support plate 11 by two socket head shoulder screws 24 and captivates the insulator block 22, socket head cap screw 26, and the collar 14 within the sub-assembly 10.

As indicated in FIGS. 3 and 4, the shield 23 has an upper end that is shaped in a bifurcated manner to lie over a major portion of the periphery of the collar 14 and is flush with the face of the support plate 11 so as to not only maintain the collar 14 in the retainer 12 but also the retainer 12 in the support plate 11. The support plate 11 and shield 23 cooperate to provide a means for holding the cathode 13 and insulator block 22.

Figures 5, 6:
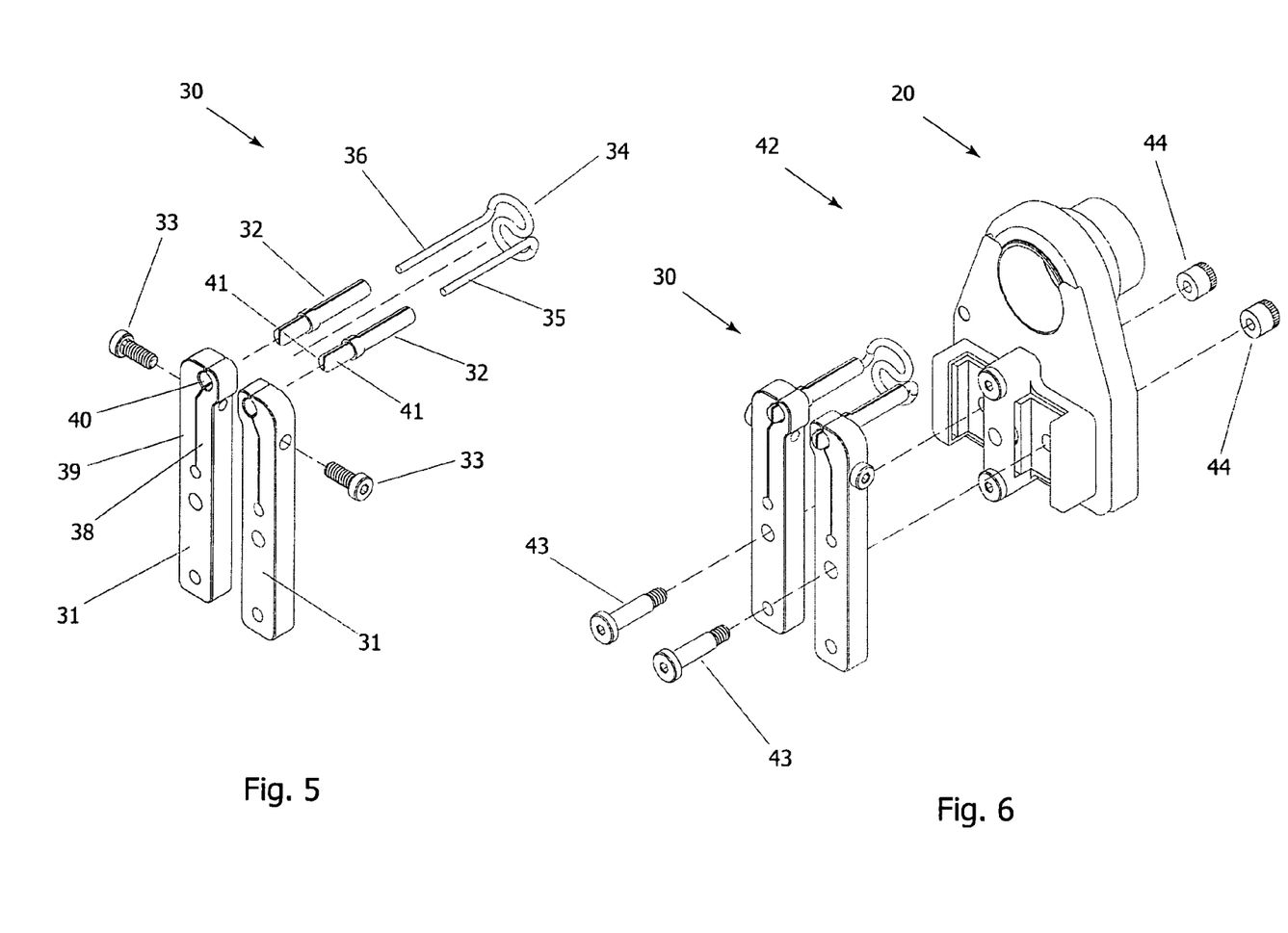
FIG. 5 is exploded perspective view of a filament clamp assembly constructed in accordance with the invention.
FIG. 6 is exploded perspective view of the cathode assembly and filament clamp assembly.
Figure 7:
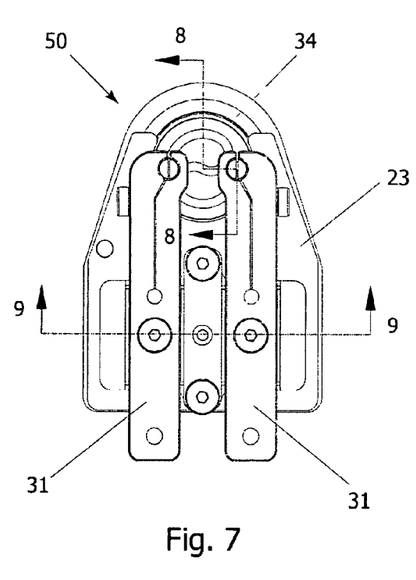
FIG. 7 is a front view of the assembled cathode assembly and filament clamp assembly.

Referring to FIG. 5, the filament clamp assembly 30 is similar to the filament clamp assembly described in co-pending U.S. patent application Ser. No. 12/655,347, filed Dec. 29, 2009, the description of which is incorporated by reference.

The filament clamp assembly 30 includes a pair of clamps 31 disposed in parallel relation, a pair of thermally insulating sleeves 32, and a pair of socket head cap screws 33 for mounting of a filament 34 having a pair of parallel connecting leads 35, 36 and a loop between the leads 35, 36. The insulating sleeves 32 provide support for the filament 34, while reducing heat transfer away from the emitting surface of the filament 34.

Each clamp 31 has a bifurcated end formed of an inside half 38 and an outside half 39 that define a slot. The inside half 38 has a threaded bore to accept a screw 33 while the outside half 39 has a through bore in alignment with the threaded bore for passage of the screw 33. Each half, 38, 39 of a clamp 31 has a recess 40. The recesses 40 are parallel to accept the thermally insulating sleeves 32.

As illustrated, each sleeve 32 has a bifurcated end 41 received in the recesses 40 of a respective clamp 31 as well as a bore for accepting the parallel connecting leads 35, 36 of the filament 34. As illustrated, each sleeve 32 is split for the entire length thereof in order to grip the leads 35, 36.

Referring to FIGS. 6 to 9, the ion source assembly 42 is composed of the filament clamp assembly 30 assembled to the cathode assembly 20 in self-aligning relation with two socket head cap screws 43 and two socket head nuts 44.

Figure 8:
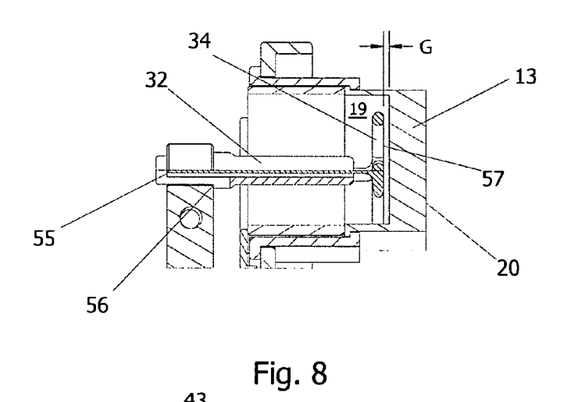
FIG. 8 is a partial cross sectional view taken on line 8-8 of FIG. 7.

As indicated in FIG. 8, when assembled, the filament 34 extends into the cavity 19 of the cathode 13 with a gap G between the loop of the filament 34 and the face of the end wall 20 of the cathode 13.

Figure 10:
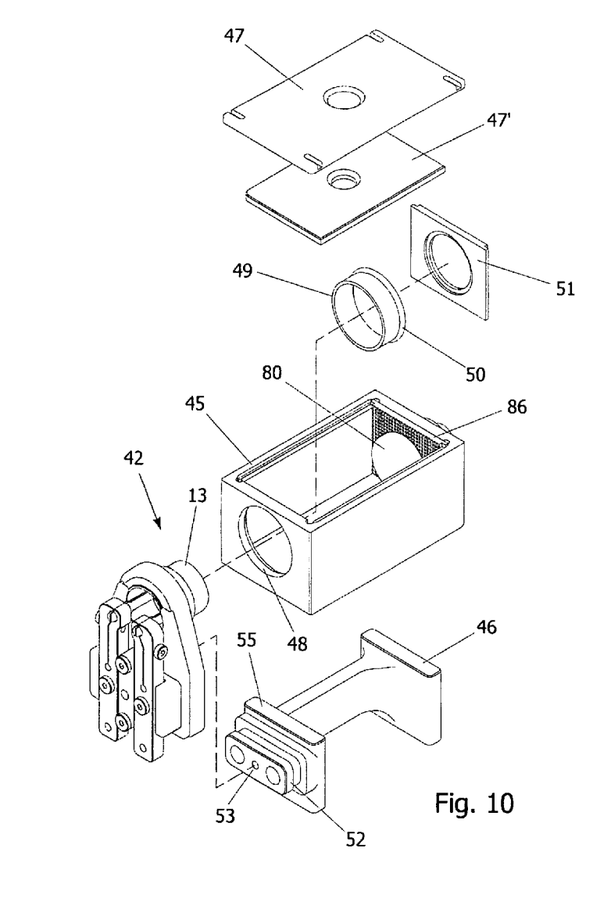
FIG. 10 is an exploded perspective view of the assembled ion source in accordance with the invention.
Figure 10A:
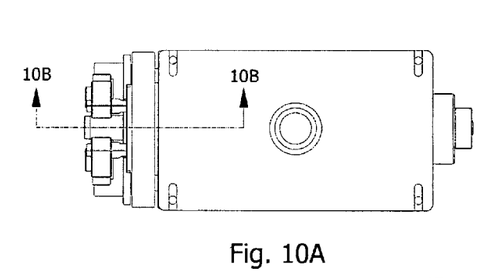
FIG. 10A is a top view of the assembled ion source of FIG. 10.

Referring to FIG. 10, wherein like reference characters indicate like parts as above, the indirectly heated cathode ion source assembly includes the ion source assembly 42, an arc chamber 45 and an arc chamber support 46.

The arc chamber 45 is of elongated box-like structure having a closed bottom, four side walls and a removable cover 47 provided with a liner 47' on the underside. In addition, the front wall of the chamber 45 has an aperture to receive the cathode 13 of the ion source assembly 42 with a circumferential gap therebetween. Both the cover 47 and liner 47' are provided with a centrally located aperture for beam extraction in a conventional manner.

Figure 10B:
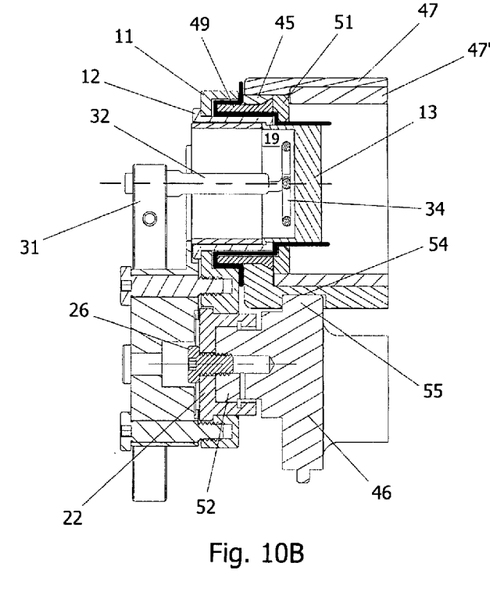
FIG. 10B is a cross sectional view of the ion source assembly taken on line 10B-10B of FIG. 10A.

The arc chamber 45 houses a sleeve 49 having a radially outwardly projecting flange 50 at one end. As illustrated in FIG. 10B, the sleeve 49 is slidably mounted in the aperture 48 of the arc chamber 45 to project outwardly thereof into a space within the graphite support plate 11 while being concentrically spaced from the cathode 13 and spaced from the support plate 11 to define a tortuous gap therebetween for throttling a flow of plasma from the internal cavity of the arc chamber 45.

The arc chamber 45 also houses an apertured liner 51 that is in abutment with the sleeve 49 and radially spaced from the cathode 13 to define a gap therebetween. The liner 51 is held in place by side liners (not shown) in the arc chamber 45.

The arc chamber support 46 is sized to support the arc chamber 45 and has a forward end with a projection 52 that slide fits into the insulator block 22 as shown in FIG. 10B. The projection 52 includes a threaded bore 53 that threadably receives the cap screw 26.

Referring to FIG. 10B, the arc chamber 45 has a groove 54 in a bottom surface that receives an upstanding projection 55 of the arc chamber support 46 to hold the arc chamber 45 against movement longitudinally away from the support plate 11.

Figure 9:
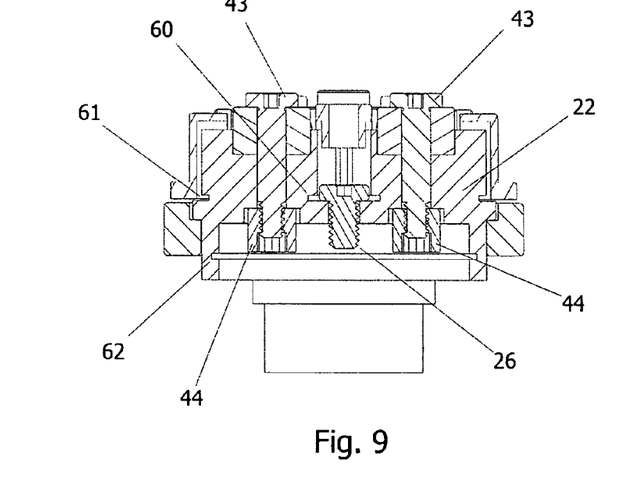
FIG. 9 is a cross sectional view taken on line 9-9 of FIG. 7.

Referring to FIG. 9, the insulator 22 is provided with undercuts 60,62. The undercuts on the insulator help to interrupt the conductive coating buildup along surfaces where the coating can cause a short.

Referring to FIGS. 10, and 11 to 13, wherein like reference characters indicate like parts as above, an arc chamber 45 is also provided with a repeller assembly 80 (anti-cathode) opposite the cathode assembly 20 for conventional manner purposes.

Figure 11:
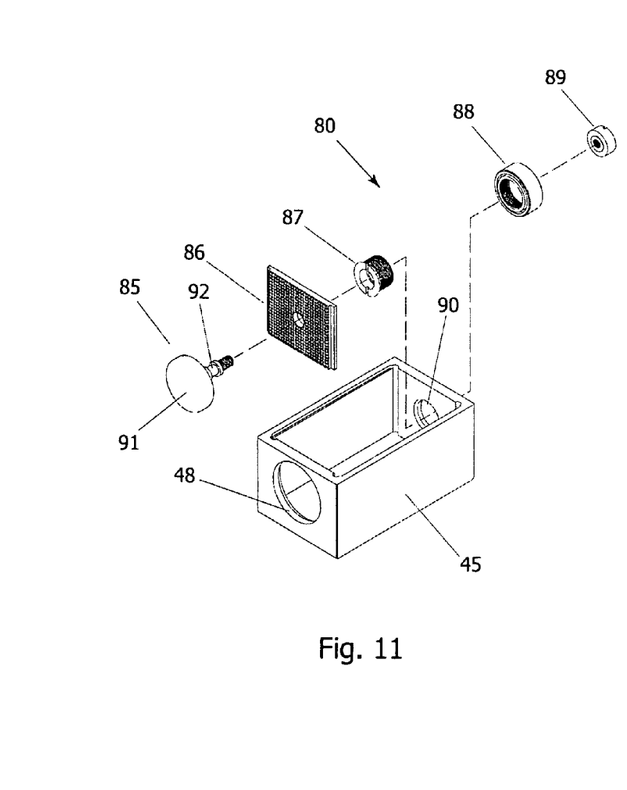
FIG. 11 is an exploded perspective view of a repeller assembly in accordance with the invention.

The repeller assembly 80 consists of a repeller 85, a liner 86, a tubular shield 87, an insulator 88 and a lock nut 89.

As illustrated, the arc chamber 45 has an opening 48 in a front wall for the cathode assembly 20 and a smaller opening 90 in a rear wall for the repeller assembly 80.

The tubular shield 87 of the repeller assembly is threadably secured in and projects outwardly from the opening 90 in the arc chamber 45 and the insulator ring 88 is threadably mounted on the tubular shield 87 to abut the arc chamber 45.

The repeller 85 has an enlarged knob-like body 91 at one end within the arc chamber 45 and an integral stem 92 that passes through the opening 90 of the arc chamber 45, the tubular shield 87 and the insulator ring 88 to define a tortuous gap between the stem 92 and each of the opening 48, tubular shield 87 and insulator ring 88.

The repeller assembly 80 also has a lock nut 89 threaded onto an end of the stem 92 into abutment with the insulator ring 88 to hold the repeller 85 in cantilevered relation within the arc chamber 45.

Figure 12:
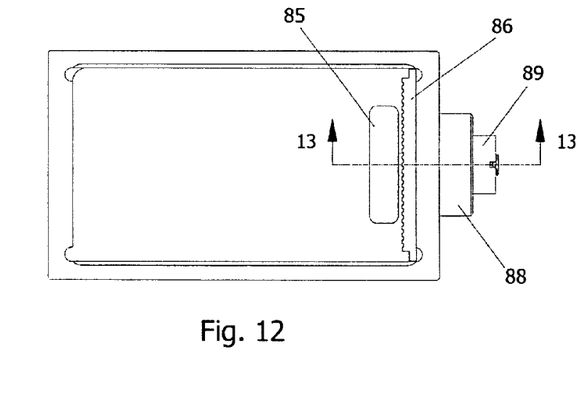
FIG. 12 is a top view of the repeller assembly of FIG. 11.
Figure 13:
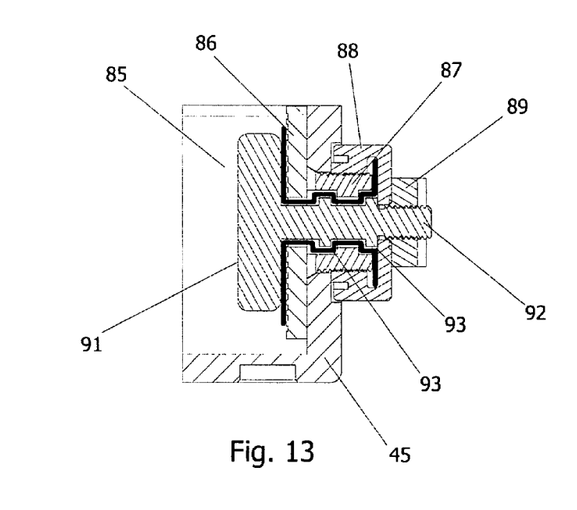
FIG. 13 is a partial cross sectional view taken on line 13-13 of FIG. 12.

As indicated in FIGS. 12 and 13, the liner 86 is disposed in the arc chamber 45 between the body 91 of the repeller 85 and the opening 90 in the arc chamber 45. The liner 86 is spaced from the body 91 of the impeller 85 to define a gap for a flow of gas from the arc chamber 45.

As indicated in FIG. 13, the stem 92 has a pair of spaced apart annular collars 93 each of which is radially spaced from the tubular shield 87 to introduce further impediments to a plasma flow from the arc chamber 45. As shown, the insulator ring 88 has a disc like end that abuts a collar 93 to close off the plasma path from the arc chamber 45 to the outside.

Referring to FIGS. 14 to 17, wherein like reference characters indicate like parts as above, a directly heated ion source employs a modified filament clamp assembly 30' for mounting a filament 34 directly in an arc chamber 45'.

Figure 14:
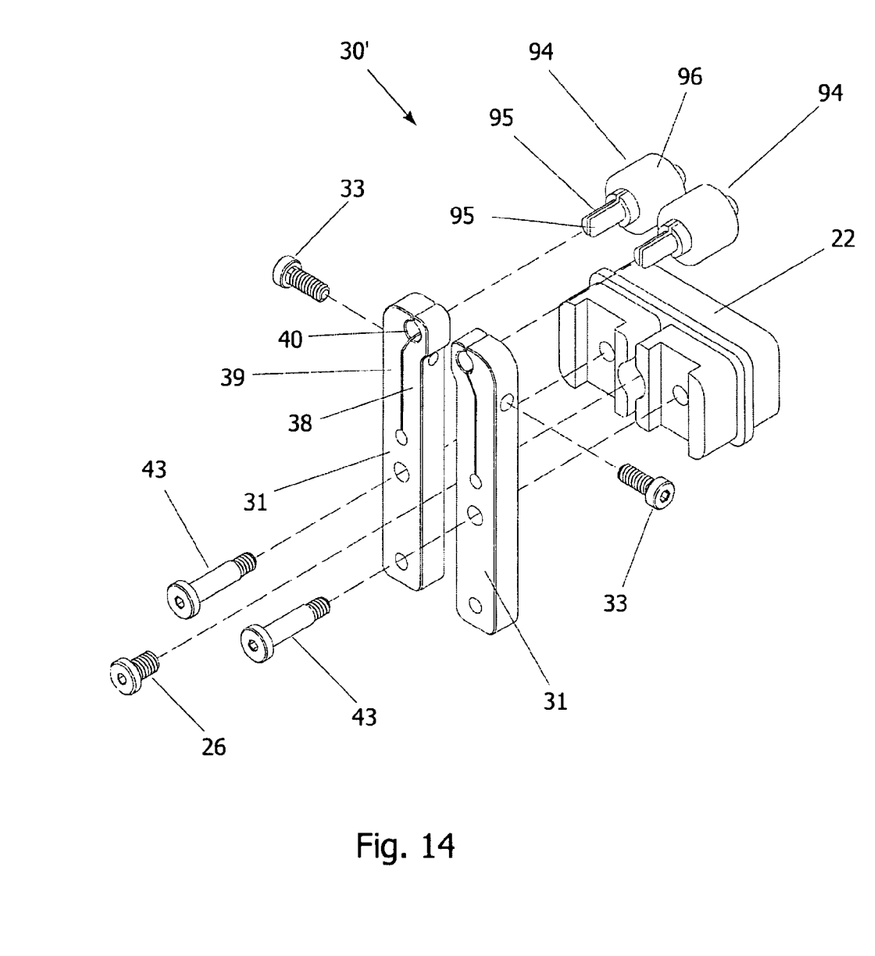
FIG. 14 is an exploded perspective view of a modified filament clamp assembly in accordance with the invention.
Figure 17:
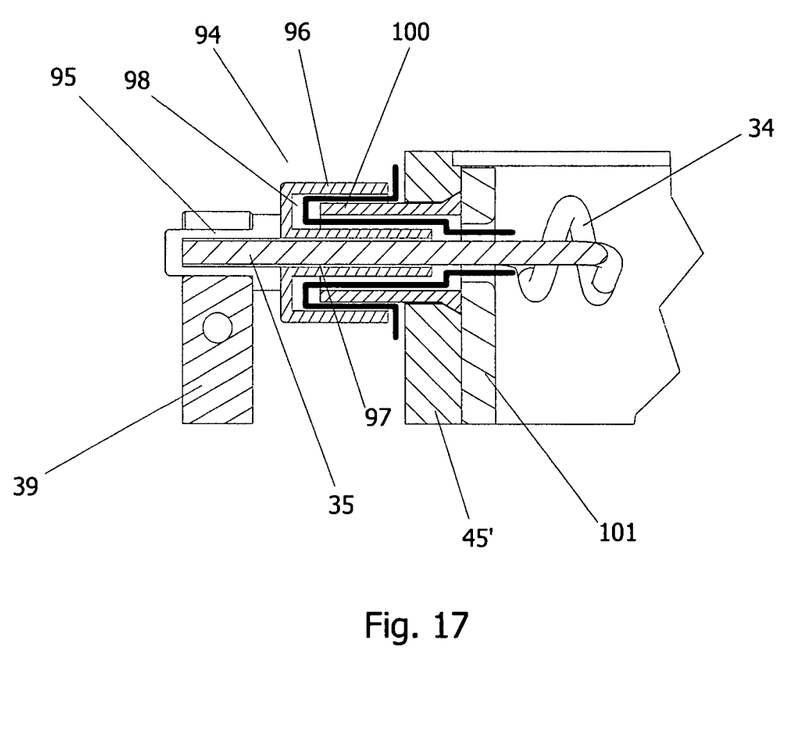
FIG. 17 is a partial cross sectional view taken on line 17-17 of FIG. 16.

As illustrated in FIGS. 14 and 17, the filament clamp assembly 30' employs a pair of thermally insulating sleeves 94 for mounting of a filament 34 having a pair of parallel connecting leads 35, 36. Each sleeve 94 has a bifurcated end 95 received in the recesses of a respective clamp 31 and a body 96 that extends from the bifurcated end 95 and has a bore 97 for passage of a respective lead 35 of the filament 34 and a concentric annular groove 98.

Figure 15:
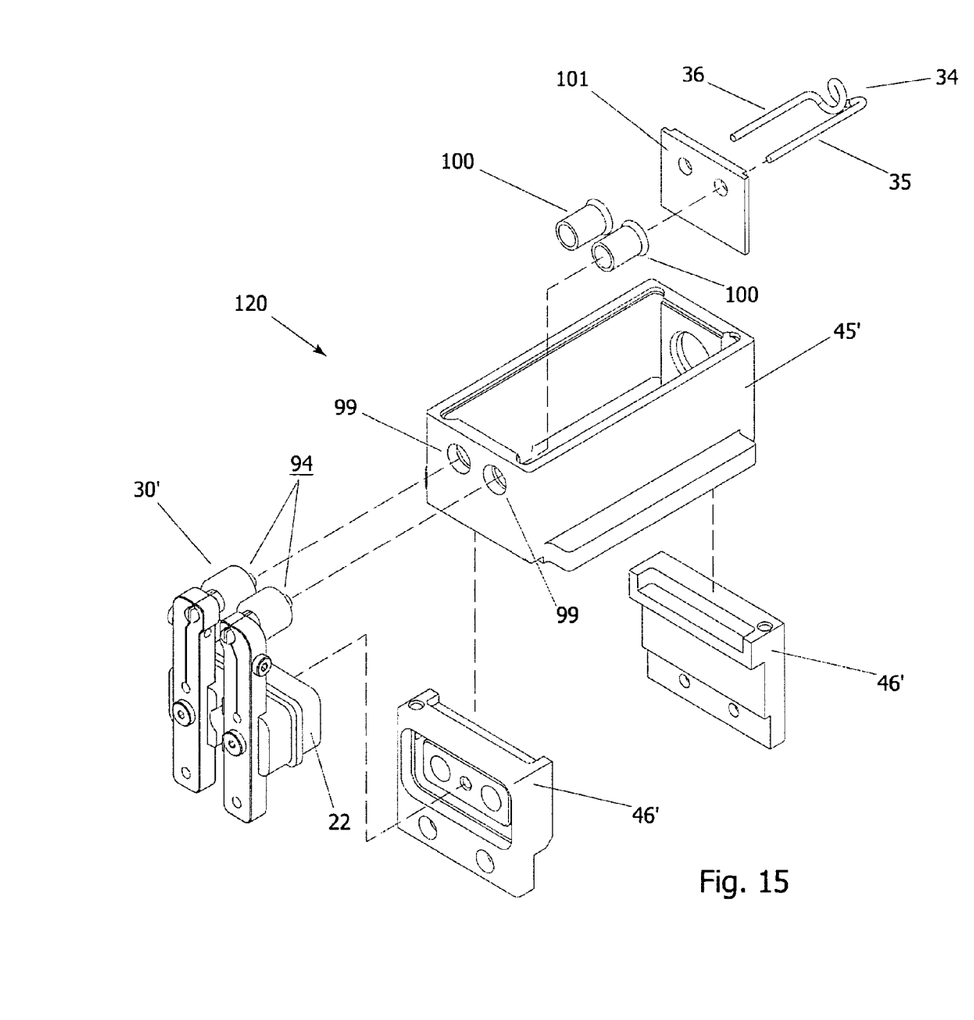
FIG. 15 is an exploded perspective view of a directly heated assembly in accordance with the invention.
Figure 16:
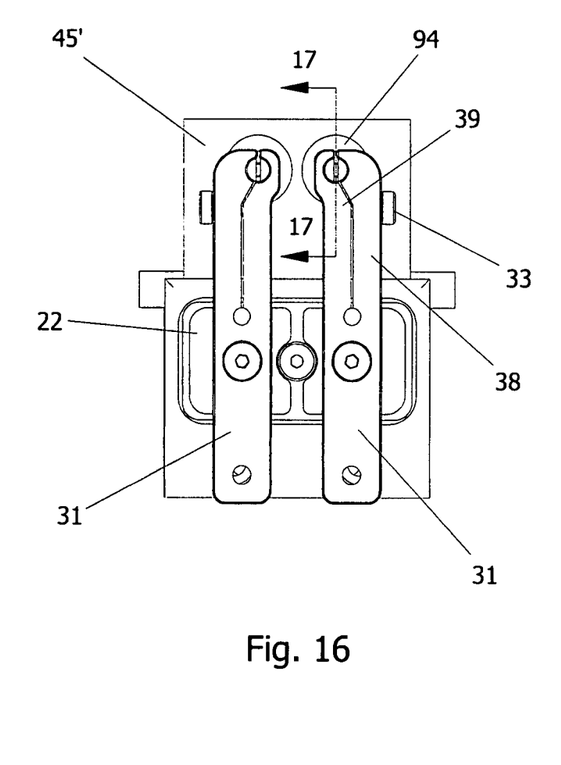
FIG. 16 is a front view of the source assembly of FIG. 15.

As illustrated in FIGS. 15 and 17, the arc chamber 45' has an internal cavity and a front wall with a pair of openings 99. A pair of sleeves 100 is located in the openings to project from the end of the arc chamber 45'.

As shown in FIG. 17, each sleeve 100 is concentric to and radially spaced from a respective lead 35, 36 of the filament 34 and disposed in spaced relation within the groove 98 of a respective insulating sleeve 94 of the filament clamp assembly to define a tortuous gap therebetween for throttling a flow of plasma from the internal cavity of the arc chamber 45'.

An apertured liner 101 is positioned in the arc chamber 45' in abutment with the sleeves 100 and radially spaced from each of the leads 35, 36 of the filament 34.

Referring to FIG. 15, the arc chamber 45' is mounted on a pair of arc chamber supports 46', 46'. As indicated, the filament clamp assembly 30' is mounted directly on the insulator block 22 and the block 22 is secured to the front of the forward arc chamber support 46' by a single socket head cap screw 26 (not shown).

What is claimed is:

1. An indirectly heated cathode ion source comprising
an arc chamber;
an arc chamber support having said arc chamber mounted thereon; and
an ion source assembly connected to said arc chamber support, said ion source assembly including
an insulator block secured to said arc chamber support;
a graphite support plate mounted on said insulator block;
a cathode assembly mounted in said support plate and having a cathode extending into said arc chamber, said cathode having a cavity open to end of said cathode and an end wall defining an end of said cavity;

a shield mounted on said support plate in covering over relation to said insulator block to prevent formation of a conductive coating on said insulator block; and a filament clamp assembly mounted on said support plate, said filament clamp assembly including a filament having a pair of parallel connecting leads extending into said cavity of said cathode and a loop extending between said leads and spaced a predetermined distance from said end wall of said cathode.

2. An indirectly heated cathode ion source as set forth in claim 1 wherein said arc chamber has an internal cavity and a sleeve projecting from one end thereof concentric to and radially spaced from said cathode assembly to define a gap therebetween for throttling a flow of plasma from said internal cavity.

3. An indirectly heated cathode ion source as set forth in claim 2 further comprising a liner in said arc chamber in abutment with said sleeve and radially spaced from said cathode assembly.

4. An indirectly heated cathode ion source as set forth in claim 2 wherein said sleeve is received in said support plate in radially spaced and axially spaced relation to define a tortuous gap therebetween for throttling a flow of plasma from said internal cavity.

* * * * *